US009276536B2

(12) United States Patent
Kimura

(10) Patent No.: US 9,276,536 B2
(45) Date of Patent: Mar. 1, 2016

(54) AMPLIFICATION APPARATUS

(71) Applicant: FUJITSU LIMITED, Kawasaki-shi, Kanagawa (JP)

(72) Inventor: Shigekazu Kimura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/293,980

(22) Filed: Jun. 2, 2014

(65) Prior Publication Data

US 2014/0368274 A1 Dec. 18, 2014

(30) Foreign Application Priority Data

Jun. 18, 2013 (JP) ................................. 2013-127856

(51) Int. Cl.

| H03F 3/68 | (2006.01) |
|---|---|
| H03F 3/193 | (2006.01) |
| H03F 1/02 | (2006.01) |
| H03F 1/32 | (2006.01) |

(52) U.S. Cl.
CPC .............. *H03F 3/193* (2013.01); *H03F 1/0294* (2013.01); *H03F 1/3247* (2013.01); *H03F 3/68* (2013.01); *H03F 2200/451* (2013.01)

(58) Field of Classification Search
CPC ... H03F 3/193; H03F 1/02094; H03F 1/3247; H03F 3/68; H03F 3/211; H03F 3/602; H03F 3/604; H03F 3/72; H03F 1/0288; H03F 3/24; H03F 2200/451; H03F 1/3241; H03F 1/3229; H03F 2201/3233; H03F 1/3276; H03F 2200/04
USPC ............................................. 330/124 R, 295
See application file for complete search history.

(56) References Cited

U.S. PATENT DOCUMENTS 7,453,320 B2 * 11/2008 Shiikuma ....................... 330/295
7,602,241 B2 * 10/2009 Suzuki et al. ................. 330/295
(Continued)

FOREIGN PATENT DOCUMENTS

| EP | 1 583 228 A2 | 10/2005 |
|---|---|---|
| JP | 2006-314087 A | 11/2006 |

(Continued)

OTHER PUBLICATIONS

Beltran et al., "High-efficiency outphasing transmitter using class-E power amplifiers and asymmetric combining," Microwave and Optical Technology Letters, vol. 51, No. 12, pp. 2959-2963 (Dec. 1, 2009).

(Continued)

*Primary Examiner* — Khanh V Nguyen
(74) *Attorney, Agent, or Firm* — Arent Fox LLP

(57) ABSTRACT

An outphasing amplification apparatus includes: a signal decomposition unit for decomposing an input signal into a first signal and a second signal having predetermined amplitude values, respectively; a first amplification element for amplifying the first signal, and output a first amplification signal; a second amplification element for amplifying the second signal, and output a second amplification signal; and a combiner for combining the first amplified signal and the second amplified signal, wherein the combiner includes a first input transmission line having an impedance converter, a second input transmission line not having an impedance converter, and a combination unit configured to combine a signal produced by the first amplification signal passing through the first input transmission line to have been subjected to impedance conversion by the impedance converter, and a signal produced by the second amplification signal passing through the second input transmission line not having been subjected to impedance conversion.

3 Claims, 5 Drawing Sheets

(56) References Cited

U.S. PATENT DOCUMENTS 7,714,648 B2 * 5/2010 Okubo et al. ................. 330/295
8,395,443 B2 * 3/2013 Aoki ............................. 330/295

FOREIGN PATENT DOCUMENTS

| JP | 2007-174148 A | 7/2007 |
| JP | 2009-213090 A | 9/2009 |
| JP | 2009-533947 A | 9/2009 |
| WO | WO 2007/117189 A1 | 10/2007 |

OTHER PUBLICATIONS

Extended European Search Report issued Aug. 27, 2014 in European Patent Application No. 14170130.0.

* cited by examiner

AMPLIFICATION APPARATUS

CROSS-REFERENCE TO RELATED APPLICATION

This application is based upon and claims the benefit of priority of the prior Japanese Patent Application No. 2013-127856, filed on Jun. 18, 2013, the entire contents of which are incorporated herein by reference.

FIELD

The embodiments discussed herein are related to amplification apparatuses.

BACKGROUND

To date, amplifiers have been used in various electronic devices. It is generally known that efficiency of an amplifier is highest at an output saturated state (that is to say, a nonlinear state).

To date, proposals have been made of an outphasing amplification apparatus (hereinafter, sometimes referred to as an "outphasing amplifier") as an amplification apparatus that causes an amplifier to operate in a saturated state. An outphasing amplifier includes two amplifiers connected in parallel, and a combiner for combining signals output from the two amplifiers, respectively. And a Chireix combiner is used as the combiner. The Chireix combiner has a λ/4 transmission line on a first line connecting a first amplifier and a combination point, and a λ/4 transmission line on a second line connecting a second amplifier and the combination point. Here, if the combined phase is not in phase, load impedance of the first amplifier has a reactance component that is the same size, but the opposite polarity as the reactance component of the load impedance of the second amplifier. Thus, in order to compensate those reactance components, the Chireix combiner is provided with a shunt reactance.

Related-art techniques have been disclosed in Japanese Laid-open Patent Publication Nos. 2009-213090, 2007-174148, and 2006-314087, and Japanese National Publication of International Patent Application No. 2009-533947.

Incidentally, improvements in power efficiency characteristic and broadband characteristic are demanded for amplification apparatuses. if a circuit size becomes large, these characteristics are deteriorated.

On the contrary, it is possible to improve these characteristics by reducing the circuit size. Accordingly, it is demanded that the circuit size of an amplification apparatus is made small as much as possible.

SUMMARY

According to an aspect of the invention, an outphasing amplification apparatus includes: a signal decomposition unit for decomposing an input signal into a first signal and a second signal having predetermined amplitude values, respectively; a first amplification element for amplifying the first signal, and output a first amplification signal; a second amplification element for amplifying the second signal, and output a second amplification signal; and a combiner for combining the first amplified signal and the second amplified signal, wherein the combiner includes a first input transmission line having an impedance converter, a second input transmission line not having an impedance converter, and a combination unit configured to combine a signal produced by the first amplification signal passing through the first input transmission line to have been subjected to impedance conversion by the impedance converter, and a signal produced by the second amplification signal passing through the second input transmission line not having been subjected to impedance conversion.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, detailed descriptions will be given of amplification apparatuses according to embodiments of the present disclosure with reference to the drawings. In this regard, the present disclosure is not limited to the amplification apparatuses of the embodiments. Also, a same reference symbol is given to a part of a configuration having a same function in the embodiments, and a duplicated description will be omitted.

First Embodiment

Figure 1:
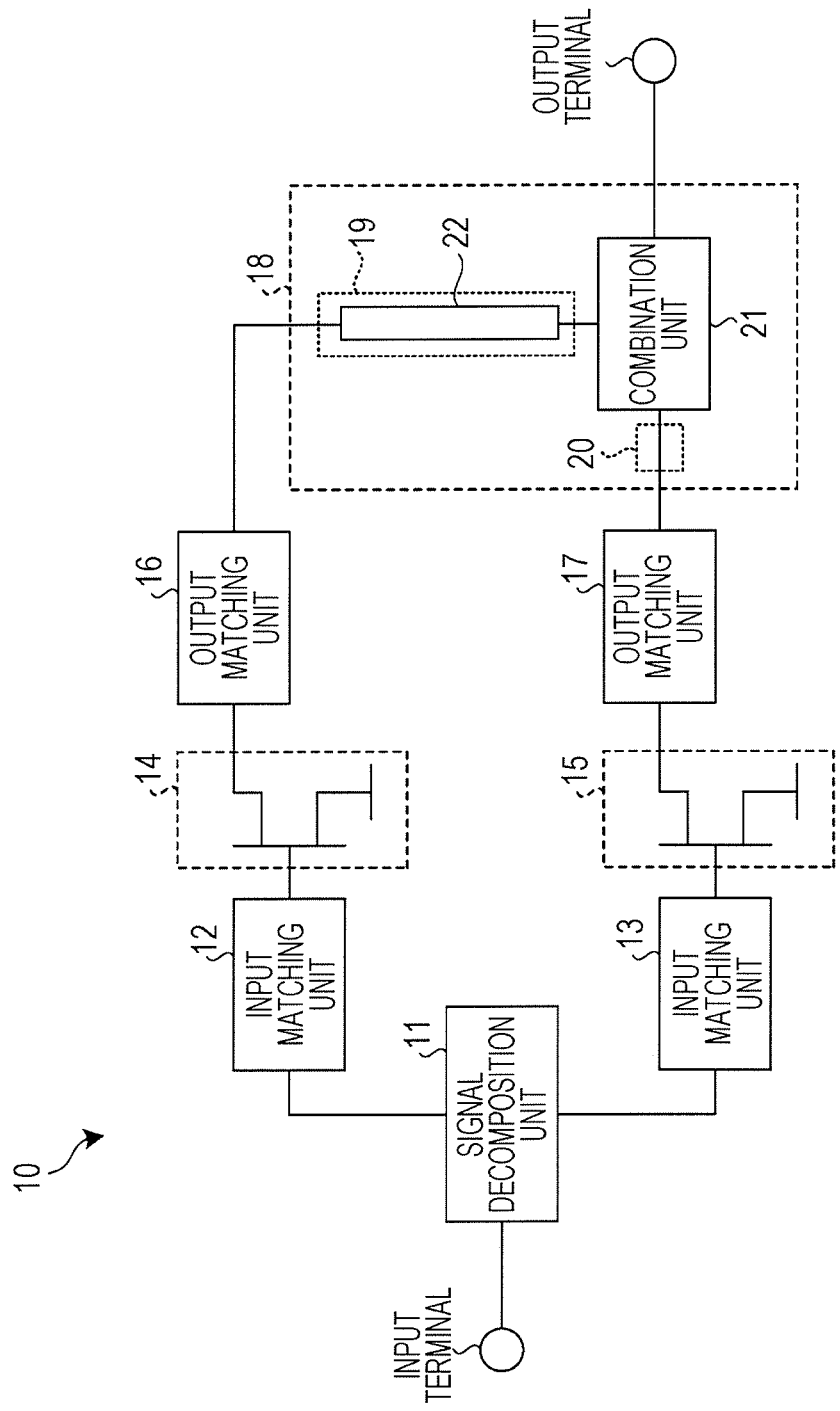
FIG. 1 is an example of an amplification apparatus according to a first embodiment.

FIG. 1 is an example of an amplification apparatus according to a first embodiment. In FIG. 1, an amplification apparatus 10 includes a signal decomposition unit 11, input matching units 12 and 13, amplification elements 14 and 15, output matching units 16 and 17, and a combiner 18. In this regard, although not illustrated in FIG. 1, in the amplification apparatus 10, each of the amplification elements 14 and 15 may be provided with a corresponding one of input bias circuits and output power source circuits.

The signal decomposition unit 11 decomposes an input signal that is input from an input terminal into a first signal and a second signal. The input signal input into the signal decomposition unit 11 has a certain amplitude value and a certain phase value at a certain point in time. And the amplitude value and the phase value of the input signal changes with time. That is to say, there is a possibility that at least one of an amplitude value and a phase value of the input signal at a first point in time may differ from those of the input signal at a second point in time. Also, the amplitude value of the first signal and the amplitude value of the second signal are the same, or stay in a predetermined error range. Also, the amplitude value of the first signal and the amplitude value of the second signal fall within amplitude values that allow the amplification element 14 and the amplification element 15 to operate in saturation regions thereof, respectively. Thereby, it is possible to improve operation efficiency of the amplification element 14 and the amplification element 15.

For example, the signal decomposition unit 11 decomposes the input signal having a first amplitude value and a first phase value into the first signal and the second signal such that a combined signal of the first signal and the second signal becomes a signal having a second amplitude value corresponding to the first amplitude value and the first phase value.

The first amplitude value and the second amplitude value may be different. In this case, the higher the first amplitude value is, the lower the second amplitude value corresponding to the first amplitude value becomes. That is to say, the signal decomposition unit 11 makes the phase difference between the first signal and the second signal larger as the first amplitude value becomes high. In this regard, a detailed description will be given of the processing operation of the signal decomposition unit 11 later.

The input matching unit 12 receives the first signal output from the signal decomposition unit 11, causes the first signal to match the input impedance of the amplification element 14, and outputs the first signal to the amplification element 14. Also, the input matching unit 13 receives the second signal output from the signal decomposition unit 11, causes the second signal to match the input impedance of the amplification element 15, and outputs the second signal to the amplification element 15.

The amplification element 14 amplifies the first signal output from the input matching unit 12, and outputs the amplified first signal (hereinafter, sometimes referred to as a "first amplification signal") to the output matching unit 16. Also, the amplification element 15 amplifies the second signal output from the input matching unit 13, and outputs the amplified second signal (hereinafter, sometimes referred to as a "second amplification signal") to the output matching unit 17. For example, the amplification element 14 and the amplification element 15 are FETs (field effect transistors) as illustrated in FIG. 1.

The output matching unit 16 obtains matching between the output impedance of the amplification element 14 and the input impedance of the combiner 18. Also, the output matching unit 17 obtains matching between the output impedance of the amplification element 15 and the input impedance of the combiner 18.

The combiner 18 combines the first amplification signal output from the amplification element 14, and the second amplification signal output from the amplification element 15.

For example, as illustrated in FIG. 1, the combiner 18 includes input transmission lines 19 and 20, and the combination unit 21. Also, the input transmission line 19 includes an impedance converter 22, whereas the input transmission line 20 does not include an impedance converter.

The impedance converter 22 is a transmission line having an electrical length Φ, for example. And the electrical length Φ is a value higher than λ/4, and lower than λ/2.

The combination unit 21 combines a signal that has been subjected to impedance conversion by the impedance converter 22 by the first amplification signal passing through the input transmission line 19, and a signal that has not been subjected to impedance conversion by the second amplification signal passing through the input transmission line 20, and outputs the combined signal from an output terminal. For example, the combination unit 21 is a connection point of the input transmission line 19 and the input transmission line 20, that is to say, a combination point.

Figure 2:
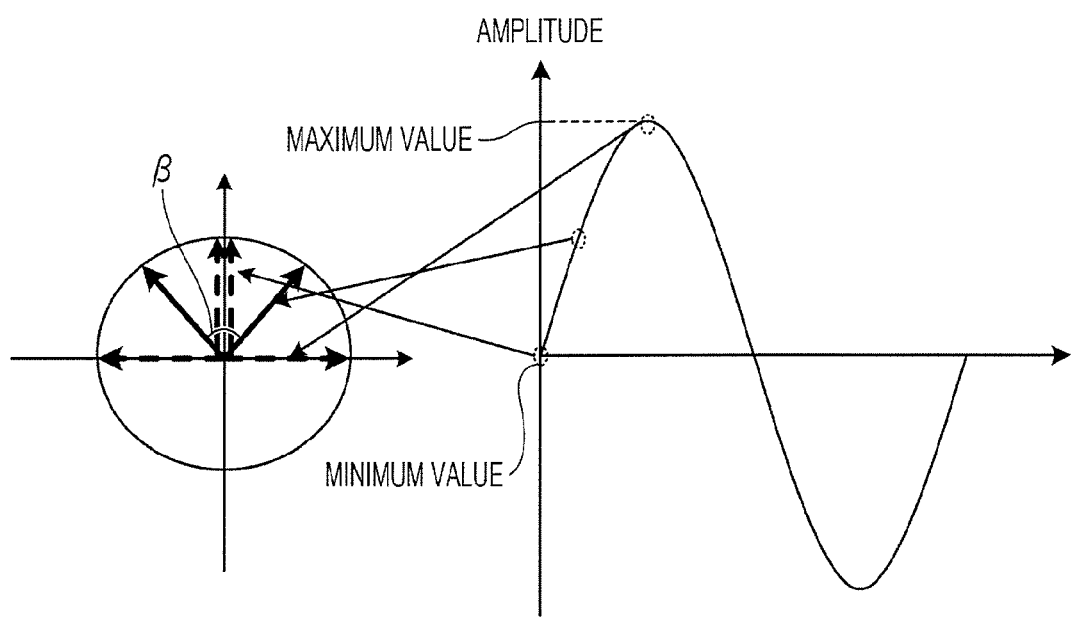
FIG. 2 is a diagram for explaining an example of processing operation of a signal processing unit according to the first embodiment.

Next, a description will be given of processing operation of the signal decomposition unit 11. FIG. 2 is a diagram for explaining an example of processing operation of a signal processing unit according to the first embodiment. FIG. 2 illustrates the case where the first amplitude value and the second amplitude value are different in particular. On the right side of FIG. 2, a permissible value of the amplitude of the input signal is illustrated. On the left side of FIG. 2, first signals and second signals are illustrated for a plurality of amplitude values, respectively. A pair of arrows illustrated in a same format on the left side of FIG. 2 illustrates a first signal and a second signal for one amplitude value.

As described above, the higher the first amplitude value is, the larger the signal decomposition unit 11 makes the phase difference β between the first signal and the second signal. For example, in FIG. 2, when the absolute value of the amplitude value is a maximum value, the phase difference β between the first signal and the second signal is 180°. That is to say, in this case, the first signal and the second signal are illustrated by a pair of broken line arrows. Also, in FIG. 2, when the absolute value of the amplitude value is a minimum value, the phase difference β between the first signal and the second signal is 0°. That is to say, in this case, the first signal and the second signal are illustrated by a pair of dash-single-dot line arrows.

Next, a description will be given of a comparison technique.

Figure 3:
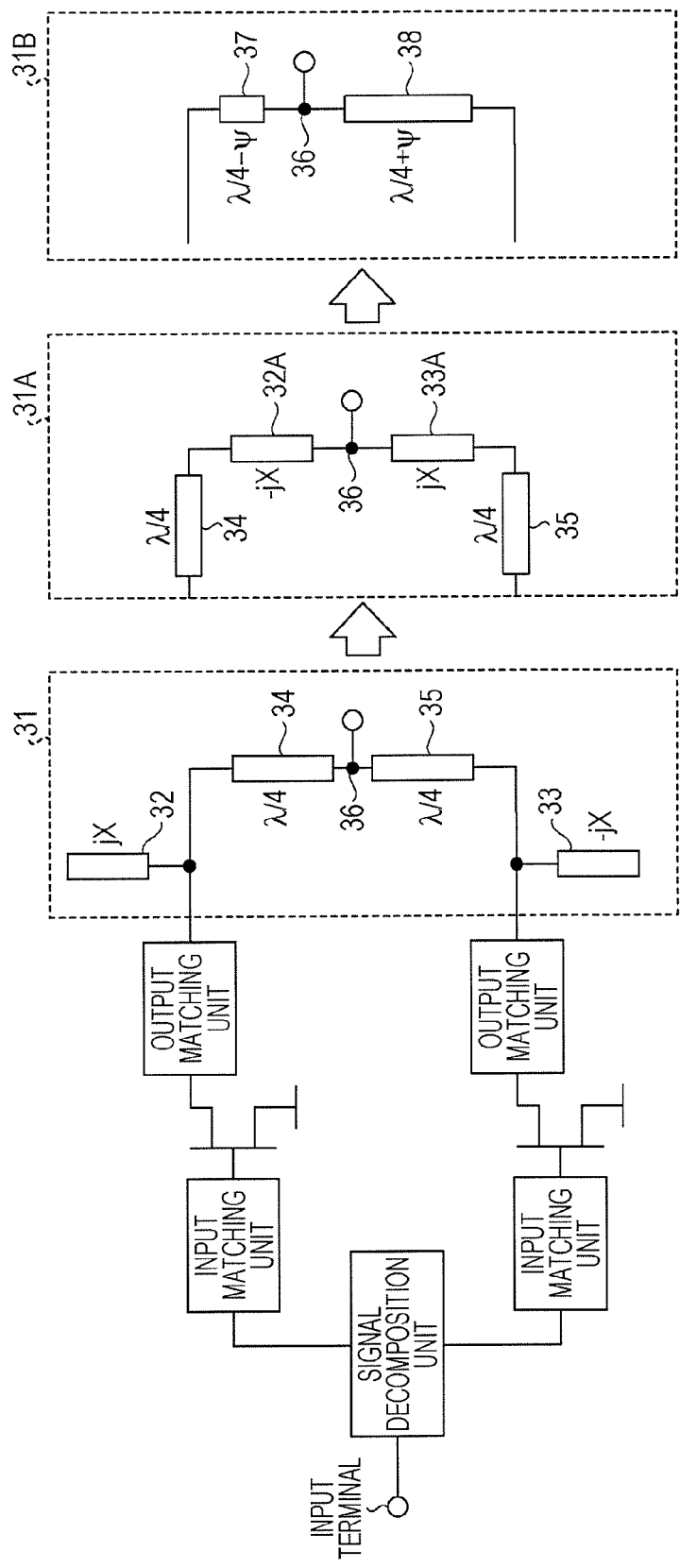
FIG. 3 is a diagram for explaining an amplification apparatus according to a comparison technique.

FIG. 3 is a diagram for explaining an amplification apparatus according to a comparison technique. The amplification apparatus including a combiner 31 in FIG. 3 has a configuration of the amplification apparatus according to the comparison technique. In FIG. 3, the combiner 31 includes a jX element 32, which is an inductive element, a −jX element 33, which is a capacitive element, λ/4 transmission lines 34 and 35, and a combination point 36. The configuration of the combiner 31 is generally known as a Chireix combiner.

And in the combiner 31, the jX element 32 and the −jX element 33 are represented by equivalent transmission lines 32A and 33A, respectively, and thus the configuration of a combiner 31A is obtained.

Further, in the combiner 31A, the λ/4 transmission line 34 and the transmission line 32A are integrated into a transmission line 37. On the other hand, the λ/4 transmission line 35 and the transmission line 33A are integrated into a transmission line 38 so that the configuration of a combiner 31B is obtained.

Figure 4:
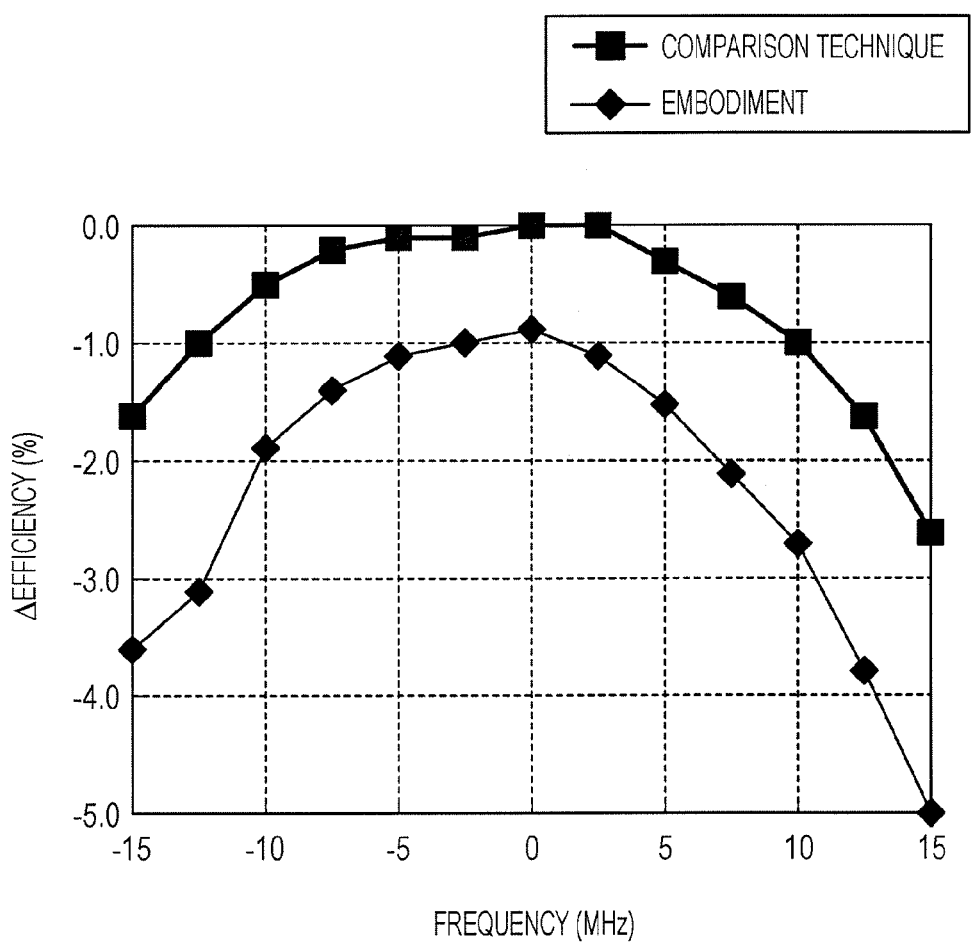
FIG. 4 is a diagram illustrating simulation results of the power efficiency characteristics of the amplification apparatus according to the first embodiment and the amplification apparatus according to the comparison technique, respectively.

Here, a comparison is made between the configuration of the amplification apparatus 10 according to the present embodiment and the configuration of the amplification apparatus according to the comparison technique. First, the combiner 31B in the amplification apparatus according to the comparison technique includes two transmission lines 37 and 38. On the other hand, the combiner 18 in the amplification apparatus 10 includes only an impedance converter 22. Also, the electrical length of the transmission lines 37 and 38 is λ/2. On the other hand, the electrical length of the impedance converter 22 (that is to say, the transmission line) is less than λ/2. That is to say, both in view of the number of parts and in view of electrical length, the circuit size of the amplification apparatus 10 is smaller than that of the comparison technique. Accordingly, the power efficiency characteristic and the broadband characteristic of the amplification apparatus 10 have been improved compared with the comparison technique. FIG. 4 is a diagram illustrating simulation results of the power efficiency characteristics of the amplification apparatuses according to the first embodiment and according to the comparison technique, respectively. The simulation result on the power efficiency characteristic of the amplification apparatus according to the comparison technique in FIG. 4 is calculated using the configuration of the combiner 31B. As is understood in FIG. 4, the power efficiency characteristic of the amplification apparatus 10 according to the first embodiment has been improved compared with the power efficiency characteristic of the amplification apparatus according to the comparison technique. In this regard, in this simulation, a substrate dielectric loss is 0.0001.

As described above, by the present embodiment, the combiner 18 in the amplification apparatus 10 includes the input transmission line 19 including the impedance converter 22, and the input transmission line 20 not including the impedance converter. Further, the combiner 18 combines a signal having been subjected to impedance conversion by the impedance converter 22 by the first amplification signal passing through the input transmission line 19, and a signal not having been subjected to impedance conversion by the second amplification signal passing through the input transmission line 20.

By the configuration of the amplification apparatus 10, it is possible to reduce the circuit size of the combiner. That is to say, it is possible to reduce the circuit size of the amplification apparatus 10. As a result, it is possible to improve the power efficiency characteristic and the broadband characteristic of the amplification apparatus.

And in the amplification apparatus 10, the higher the first amplitude value, which is the amplitude value of the input signal, is, the larger the signal decomposition unit 11 may make the phase difference between the first signal and the second signal.

Second Embodiment

Figure 5:
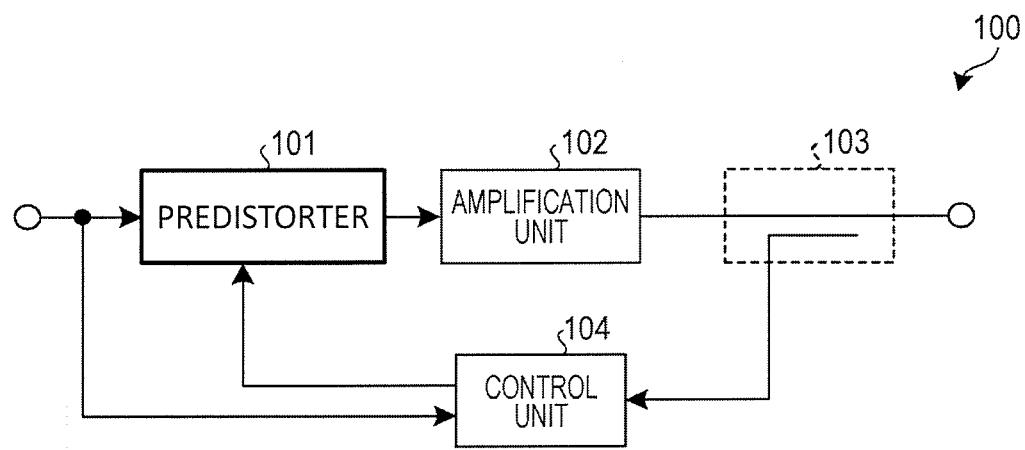
FIG. 5 is a diagram illustrating an example of an amplification apparatus according to a second embodiment.

FIG. 5 is a diagram illustrating an example of an amplification apparatus according to a second embodiment. In FIG. 5, the amplification apparatus 100 includes a predistorter 101, an amplification unit 102, a combiner 103, and a control unit 104. The amplification unit 102 has the same configuration as that of the amplification apparatus 10 according to the first embodiment.

The predistorter 101 performs distortion compensation on the input signal using a distortion compensation coefficient corresponding to the amplitude value of the input signal, and outputs a signal after the distortion compensation to the amplification unit 102. For example, the predistorter 101 has a look-up table that associates an amplitude value with a distortion compensation coefficient. And the predistorter 101 performs distortion compensation on the input signal using a distortion compensation coefficient associated with the amplitude value of the input signal in the look-up table.

The combiner 103 feeds back the output signal of the amplification unit 102 to the control unit 104.

The control unit 104 compares the input signal of the amplification apparatus 100 and the feedback signal from the combiner 103, and calculates an update coefficient based on both of the signals. And the control unit 104 updates the look-up table by the calculated update coefficient.

As described above, by the present embodiment, it is possible for the amplification apparatus 100 to perform distortion compensation.

Other Embodiments

1. In the first embodiment and the second embodiment, a description has been given on the assumption that the first amplitude value and the second amplitude value are different. However, the present disclosure is not limited to this. That is to say, the first amplitude value and the second amplitude value may be the same. In this case, the first signal and the second signal are combined into the input signal.

Figure 6:
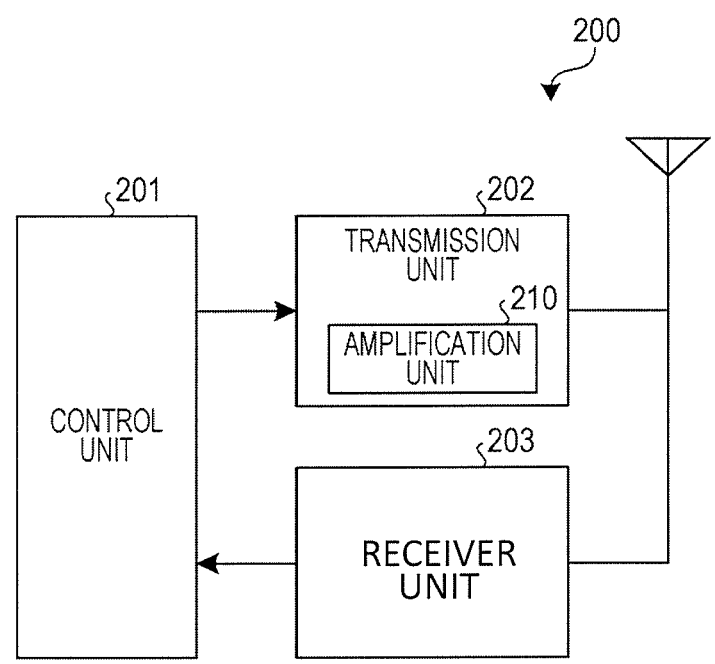
FIG. 6 is a diagram for explaining an application of the amplification apparatuses according to the first embodiment and the second embodiment.

2. It is possible to apply the amplification apparatuses according to the first embodiment and the second embodiment to a communication apparatus, for example. FIG. 6 is a diagram for explaining an application of the amplification apparatuses according to the first embodiment and the second embodiment.

In FIG. 6, the communication apparatus 200 includes a control unit 201, a transmission unit 202, and a receiver unit 203.

The control unit 201 outputs a transmission signal to the transmission unit 202.

The transmission unit 202 performs modulation, up-conversion, amplification, and the like on the input transmission signal, and transmits the signal through the antenna. The transmission unit 202 includes an amplification unit 210, and the amplification unit 210 performs amplification. The amplification unit 210 corresponds to the amplification apparatus 10 or the amplification apparatus 100.

The receiver unit 203 performs predetermined reception processing on the signal received through the antenna, and outputs the reception signal after having been subjected to the reception processing to the control unit 201.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An outphasing amplification apparatus comprising:
   a predistortion unit configured to compensate an input signal and output an adjusted input signal, based on a distortion compensation coefficient;
   a signal decomposition unit configured to decompose the adjusted input signal into a first signal and a second signal having predetermined amplitude values, respectively;
   a first amplification element configured to amplify the first signal, and output a first amplification signal;
   a second amplification element configured to amplify the second signal, and output a second amplification signal;
   a combiner configured to combine the first amplified signal and the second amplified signal, and
   a control unit configured to compare the input signal and a feedback signal from the combiner, and generate the distortion compensation coefficient which is input to the predistortion unit;
   wherein the combiner includes
   a first input transmission line having an impedance converter,
   a second input transmission line not having an impedance converter, and
   a combination unit configured to combine a signal produced by the first amplification signal passing through the first input transmission line to have been subjected to impedance conversion by the impedance converter, and a signal produced by the second amplification signal passing through the second input transmission line not having been subjected to impedance conversion.

2. The amplification apparatus according to claim 1, wherein the signal decomposition unit decomposes the adjusted input signal having a first amplitude value and a first phase value into the first signal and the second signal such that a combined signal of the first signal and the second signal becomes a signal having a second amplitude value corresponding to the first amplitude value and the first phase value.

3. The amplification apparatus according to claim 2, wherein the signal decomposition unit increases a phase difference between the first signal and the second as the first amplitude value becomes higher.

* * * * *